(12) United States Patent
Nakai et al.

(10) Patent No.: US 8,197,594 B2
(45) Date of Patent: Jun. 12, 2012

(54) SILICON WAFER FOR SEMICONDUCTOR AND MANUFACTURING METHOD THEREOF

(75) Inventors: Katsuhiko Nakai, Yamaguchi (JP);
Wilfried von Ammon, Hochburg/Ach (AT); Sei Fukushima, Kanagawa (JP);
Herbert Schmidt, Halsbach (DE);
Martin Weber, Kastl (DE)

(73) Assignee: Siltronic AG, Munich (DE)

( * ) Notice: Subject to any disclaimer, the term of this patent is extended or adjusted under 35 U.S.C. 154(b) by 1279 days.

(21) Appl. No.: 11/857,460

(22) Filed: Sep. 19, 2007

(65) Prior Publication Data
US 2008/0113171 A1   May 15, 2008

(30) Foreign Application Priority Data

Sep. 20, 2006 (JP) ................................ 2006-254946
Jul. 6, 2007   (JP) ................................ 2007-178920

(51) Int. Cl.
*C30B 29/06* (2006.01)

(52) U.S. Cl. ............. 117/2; 117/3; 117/13; 117/15; 117/20

(58) Field of Classification Search ............... 117/13, 117/15, 2, 3, 20
See application file for complete search history.

(56) References Cited

U.S. PATENT DOCUMENTS

| | | | |
|---|---|---|---|
| 5,502,231 A | 3/1996 | Engelhardt et al. | |
| 5,935,320 A | 8/1999 | Graef et al. | |
| 2003/0157814 A1* | 8/2003 | Iida et al. | 438/795 |
| 2004/0180505 A1* | 9/2004 | Tobe | 438/310 |
| 2005/0039671 A1* | 2/2005 | Watanabe et al. | 117/19 |
| 2007/0218570 A1* | 9/2007 | Nakamura et al. | 438/5 |

FOREIGN PATENT DOCUMENTS

| | | |
|---|---|---|
| JP | 08213403 A | 8/1996 |
| JP | 10098047 A | 4/1998 |
| JP | 2000281491 A | 10/2000 |
| JP | 2006040980 A | 2/2006 |

* cited by examiner

*Primary Examiner* — Bob M Kunemund
(74) *Attorney, Agent, or Firm* — Brooks Kushman P.C.

(57) ABSTRACT

Silicon wafers having a density of BMDs with sizes between 20 to 40 nm at positions $\geq 20$ μm below the wafer surface in the range of $5\times10^{11}/cm^3$, and a density of BMDs with sizes of $\geq 300$ nm $\leq 1\times10^7/cm^3$, exhibit reduced slip dislocation and warpage. The wafers are sliced from a crystal grown under specific conditions and then subjected to both low temperature heat-treatment and high temperature anneal.

16 Claims, 3 Drawing Sheets

SILICON WAFER FOR SEMICONDUCTOR AND MANUFACTURING METHOD THEREOF

BACKGROUND OF THE INVENTION

1. Field of the Invention

The present invention relates to a silicon product wafer obtained by heat treating a silicon "substrate" wafer which has been sliced from a silicon single crystal ingot, and has not been subjected to any prior heat treatment, and in particular to a high quality silicon wafer with minimal and preferably no crystal defects in semiconductor device forming regions by suppressing occurrences of slip dislocations and warpage, and to a manufacturing method therefor.

2. Background Art

Silicon wafers used as substrates for semiconductor devices and the like are manufactured by slicing a silicon single crystal ingot, and processing the sliced wafers, for example by processing steps including heat treatment, mirror polishing, and the like. The Czochralksi method (CZ) is one manufacturing method for producing such silicon single crystal ingots, and also is the most common method, since it is relatively easy to obtain single crystal ingots with a large diameters while also exerting control over defects.

Silicon single crystals (CZ-Si) pulled by the CZ method always contain crystal defects called "grown-in defects". Oxygen dissolves in the CZ-Si lattice (interstitial oxygen) in a supersaturated state, and the supersaturated oxygen, through oxygen precipitation, produces fine defects called "BMDs" (Bulk Micro Defects) in subsequent heat treatments (anneals) conducted.

In order to construct a semiconductor device on a silicon wafer, it is required that no crystal defects are present in the semiconductor device forming region. When crystal defects are present in the surface on which a circuit is desired to be formed, however, an open circuit or the like is frequently caused by the defect. Meanwhile, however, it is also required that the silicon wafer include BMDs in a proper amount therein. The BMDs serve to getter metal impurities and the like. Metal impurities are one cause of semiconductor device malfunction.

In order to address the above requirements, silicon wafers are subjected to a high-temperature anneal to induce BMDs in the silicon wafer to form an IG (intrinsic gettering) layer, and also to diminish grown-in defects present in the surface of the silicon wafer to form a DZ denuded zone ("DZ") layer where crystal defects are preferably completely absent. As a specific example of such a process, a nitrogen-doped substrate, or a substrate doped with both nitrogen and hydrogen is high-temperature annealed to reduce grown-in defects on the surface of the substrate, and form BMDs in the substrate core. (JP-A-10-98047 and JP-A-2000-281491).

However, oxygen concentrations in the DZ layers formed on the front surface and a back surface of the silicon wafer in the high-temperature annealing process are extremely reduced due to out-diffusion of oxygen during heat treatment. As a result, restraint of propagation of dislocation defects from the wafer front and back surfaces is considerably reduced, and slips (dislocation defects) easily extend from the fine flaws on the surfaces introduced during the annealing process into the bulk of the wafer. As a result, the strength of the silicon wafer is reduced due to propagation of such slip dislocations. For example, when a silicon wafer is annealed while supported by heat treatment pins or the like, slip dislocations often extend from the supported portions across the back face of the wafer, and through to the front surface. Slip dislocations may also extend from the silicon wafer edge portion.

When the strength of the silicon wafer is lowered, there is a concern that wafers may become damaged or broken during wafer processing or device fabrication steps. However, a DZ layer is often necessary for semiconductor device formation, and thus a silicon wafer that has a DZ layer but also exhibits excellent strength properties has been required.

In conventional wafer processing, as disclosed in JP-A-10-98047 or JP-A-2000-281491, attention was not directed to maintaining the strength of the silicon wafers, and silicon wafers manufactured by the disclosed processes cannot avoid slip dislocation propagation.

In order to prevent the occurrence of slip dislocations, a method for generating BMDs at a high density has been proposed. Specifically, silicon wafers with oxygen precipitation nuclei with sizes of $\leqq 20$ nm in an amount of $1 \times 10^{10}$ atoms/cm$^3$ or more are formed in the BMD layer by heat treating a substrate sliced from a silicon signal crystal ingot at a temperature of 500 to 1200° C. for a time of 1 to 600 minutes under a mixed gas atmosphere consisting of nitrogen gas and inert gas, or a mixed gas of ammonia and inert gas wherein the heating and cooling rates are rapid. (JP-A-2006-40980). In JP-A-08-213403, BMDs in a high concentration of $1 \times 10^{10}$ atoms/cm$^3$ to $1 \times 10^{12}$ atoms/cm$^3$ are generated in silicon wafers by repeating heat treatment steps several times.

For large diameter silicon wafers, rapid heating and cooling rates prior to and after heat treatment, for example when using a Rapid Thermal Annealer (RTA), warpage becomes problematic in addition to slip dislocations.

An illustrative diagram of slips and warpage introduced by the RTA heat treatment is shown in FIG. 1. Slips are introduced from a contacting point between a wafer back surface and a wafer support pin. The slips introduced propagate in a 110 direction, which causes wafer damage or even breakage in some cases. Warpage is a phenomenon where a wafer is deformed due to heat strain during the RTA heat treatment. In a wafer of 100 orientation, for example, a mountain-shaped portion and a valley-shaped portion appear, as shown in FIG. 1. Warpage of silicon wafers as shipped is generally equal to or less than 10 μm. However, following RTA, a difference in height between the mountain and the valley portions may reach several tens of μm. When warpage becomes large, a semiconductor device pattern cannot be properly focused on the wafer surface, resulting in a decrease in semiconductor device yield. High densities of slip dislocation are present in silicon wafers where large warpage has occurred. It is believed that these slip dislocations cause the warpage.

Warp becomes especially significant when the wafer diameter becomes greater than or equal to 200 mm, and in such wafers it is impossible to avoid the problem only by establishing a high BMD concentration, as discussed above.

Thus, there has been a great demand for silicon wafers of high quality which do not include crystal defects in the semiconductor device forming region, wherein slip dislocations and warp are suppressed during device manufacturing, and also a manufacturing technique therefor.

SUMMARY OF THE INVENTION

It is an object of the present invention to provide a silicon wafer of high quality where both slip dislocation and warp are suppressed to considerably small values and which is suitable for wafers of large diameter, and to a manufacturing method therefor. The present inventors have extensively studied the relationships among BMD size distribution, slip dislocation, and warp, with the goal of making it possible to manufacture an excellent silicon wafer satisfying the above demands. As a result, the present inventors have discovered a unique BMD size distribution which prevents both slip dislocation and warp.

BRIEF DESCRIPTION OF THE DRAWINGS

FIG. 2 (A) illustrates the BMD size distribution of claim 1 which suppresses both slip and warp amount to certain minima, whereas in other combinations of BMD size distributions shown in (B) to (E) at least one of slip or warp is undesirably high as illustrated in each of the slip/warpage tables (x means slip/warp is "is not OK", ○ means slip/warpage "is acceptable").

DETAILED DESCRIPTION OF THE PREFERRED EMBODIMENT(S)

Figure 1:
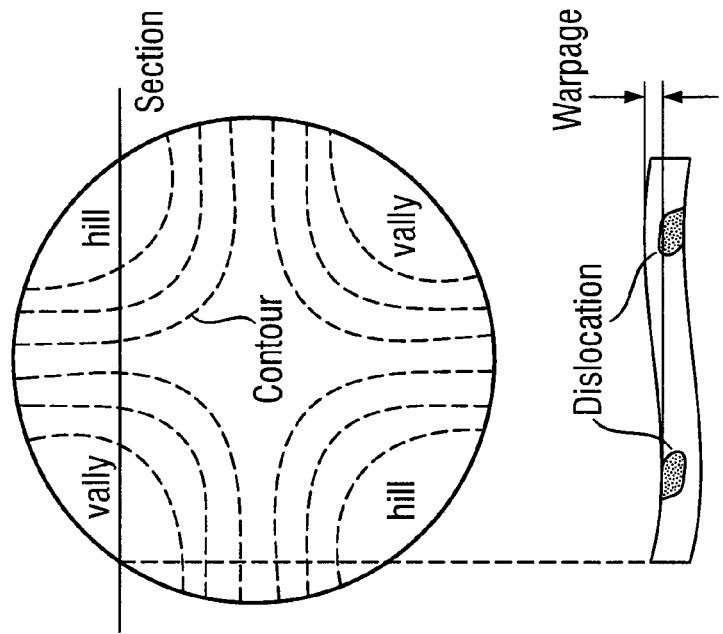
FIG. 1 is a diagram for explaining slip and warp introduced by RTA heat treatment.
Figure 1:
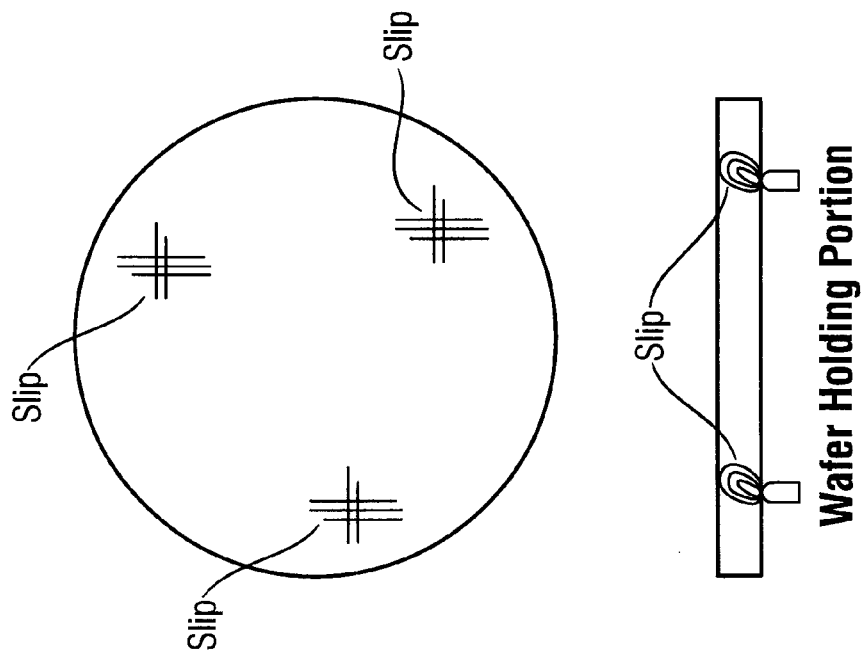
Figure 2:
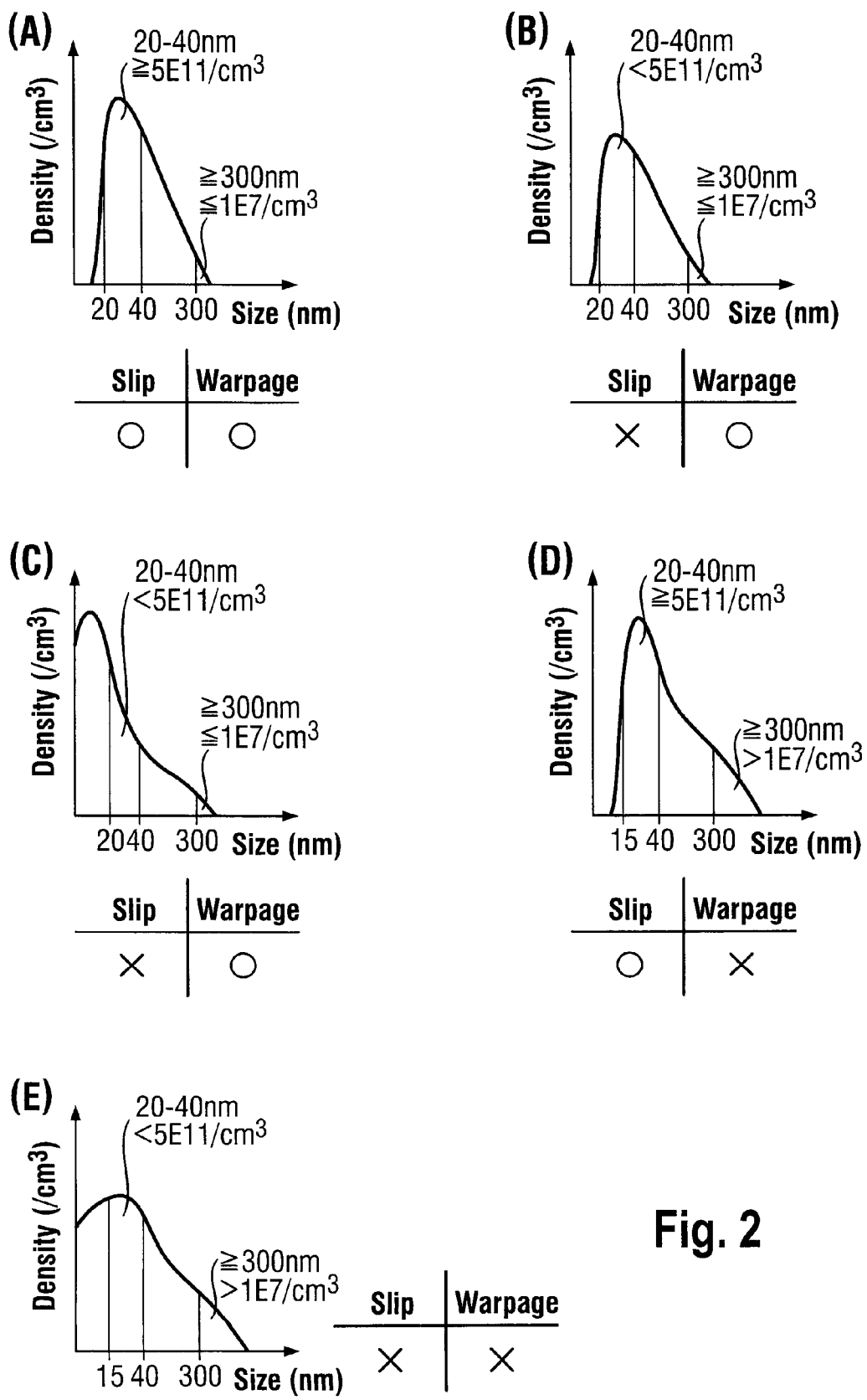
FIG. 2 illustrates a relationship between BMD size distribution and slip/warp, from data presented in Tables 1-5.
Figure 3:
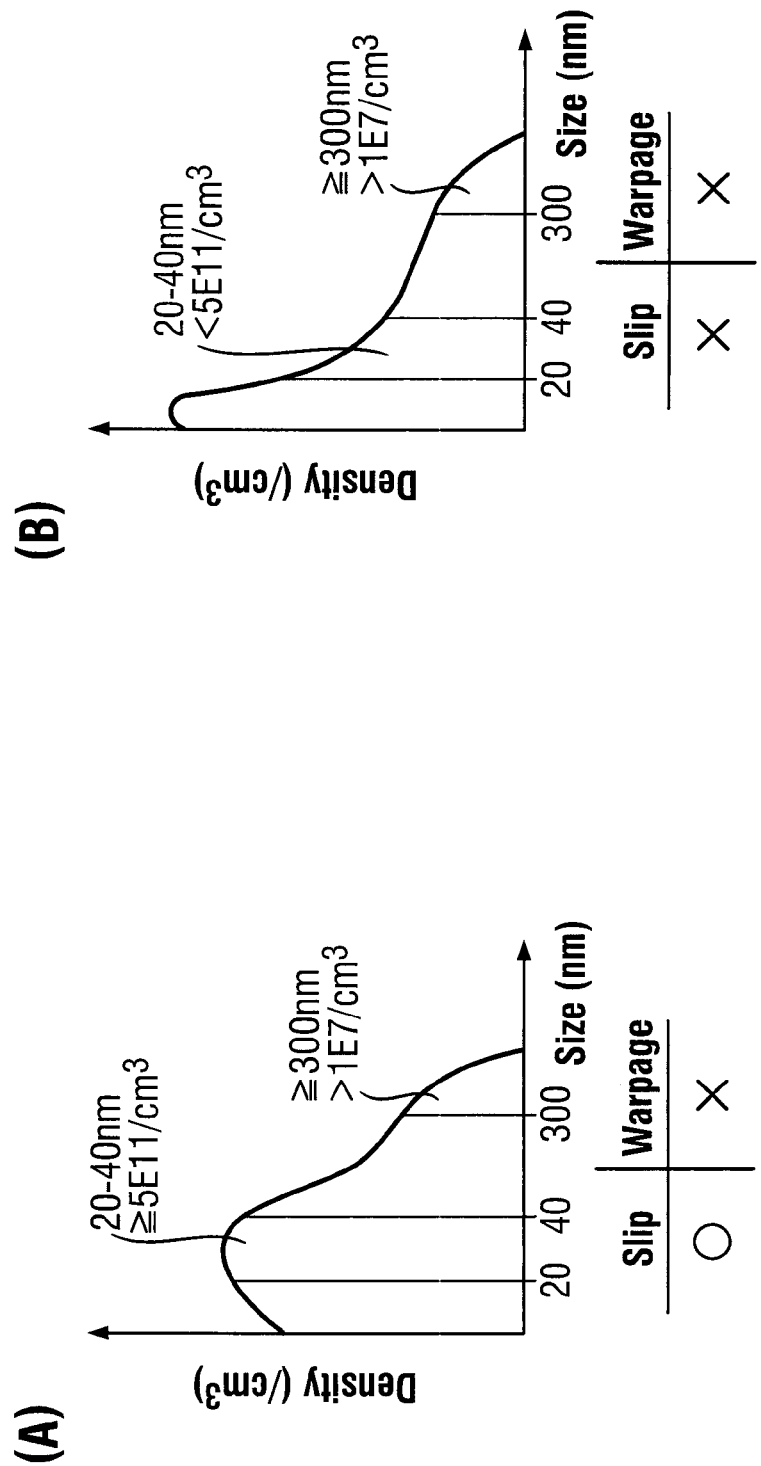
FIGS. 3a and 3b illustrates the relationship between a prior art BMD size distribution and slip/warp.

The present invention relates to the following embodiments, as described below, but is not limited thereto.

One embodiment of the subject invention is directed to a silicon wafer wherein the density of BMDs with sizes of 20 nm to 40 nm is in the range of $5 \times 10^{11}/cm^3$ to $5 \times 10^{13}/cm^3$ in a bulk portion of the wafer separated from the surface of the silicon wafer by a distance $\geq 20$ μm, and wherein the density of BMDs with sizes of $\geq 300$ nm or more is $\leq 1 \times 10^7/cm^3$.

In a further embodiment, the silicon wafer described above is doped with nitrogen or hydrogen, more preferably with nitrogen and hydrogen.

The subject invention is also directed to a manufacturing method for one of the previously described silicon wafers comprising growing a silicon single crystal ingot while maintaining a cooling rate in a range in which a center temperature of the crystal during silicon single crystal growth changes from 1000° C. to 900° C. at a rate of 5° C./min or more; processing a wafer substrate from the single crystal ingot; heat treating the substrate at a temperature of 400° C. to 850° C. for 30 minutes to 4 hours; and heat treating the substrate at a temperature of 1100° C. to 1250° C. for 10 minutes to 2 hours under an atmosphere of noble gas having an impurity concentration of 0.5% or less by volume or under a non-oxidizing atmosphere where the thickness of an oxidized film after heat treatment the high-temperature anneal step is $\leq 2$ nm.

In the manufacturing method just described, the oxygen concentration in the substrate, immediately after being sliced from the crystal and prior to heat treatment is in the range of $7 \times 10^{17}$ atoms/cm³ to $9 \times 10^{17}$ atoms/cm³.

In a yet further embodiment of the manufacturing method for the silicon wafers described above, the nitrogen concentration of the substrate just after being sliced from a crystal falls in the range of $1 \times 10^{13}$ atoms/cm³ to $8 \times 10^{15}$ atoms/cm³, and preferably, the silicon wafer silicon is derived from a single crystal ingot grwon from the melt such that nitrogen concentration falls within the range of $1 \times 10^{16}$ atoms/cm³ to $1 \times 10^{19}$ atoms/cm³.

In a still further embodiment, the silicon wafer described in any one of the above paragraphs has a hydrogen concentration, just after being sliced from a crystal, within the range of $1 \times 10^{12}$ atoms/cm³ to $5 \times 10^{16}$ atoms/cm³. Preferably, the silicon wafer is derived from a silicon single crystal ingot grown under an atmosphere where hydrogen gas is continuously introduced such that a concentration of the hydrogen gas falls within the range of 0.01% to 3% by volume.

In a still further embodiment, the silicon wafer described in any one of the above paragraphs has an epi-layer deposited by epitaxial deposition after the high-temperature anneal.

The silicon wafers of the present invention make it possible to provide silicon wafers with a large diameter (typically, 200 mm or more) with high quality by establishing a density of BMDs with sizes of 20 nm to 40 nm in the bulk wafer at a distance of 20 μm or more from the surface of the silicon wafer in the range of $5 \times 10^{11}/cm^3$ to $5 \times 10^{13}/cm^3$, and wherein the density of BMDs with sizes of 300 nm or more is equal to or less than $1 \times 10^7/cm^3$, thereby limiting both slip dislocation and warpage to extremely low values.

The silicon wafer of the present invention exhibits a reduced occurrence of slip dislocation and warpage as compared with an otherwise similar wafer that has no BMD inside the wafer, while also exhibiting excellent gettering ability.

Silicon Wafer

A feature of the silicon wafer according to the present invention lies in that the density of BMDs with sizes of 20 nm to 40 nm of BMDs in the body of the wafer 20 μm or more below the wafer surface, is in a range of $5 \times 10^{11}/cm^3$ to $5 \times 10^{13}/cm^3$.

From intensive investigation into the state of BMDs generated inside a wafer after heat treatment, it has now been surprisingly discovered that a wide distribution of BMD sizes is present. A relationship among the BMD size distribution present 20 μm or more below the wafer surface strongly influences the characteristics of slips and warpage. As a result, a BMD distribution which prevents slip has been discovered. Thus, by generating BMDs with sizes of 20 nm to 40 nm at a density of $5 \times 10^{13}/cm^3$ to $5 \times 10^{13}/cm^3$, lengths of slips can be suppressed to 10 mm or less. When the lengths of slips are equal to or less than 10 mm, the slips are not exposed at the surface of the silicon wafer. Even if a slip occurs at a wafer edge portion, when the length of the slip is equal to or less than 10 mm, the slip does not reach the semiconductor device forming region, and it therefore does not influence devices fabricated on the wafer adversely.

When sizes of BMDs are less than 20 nm or a BMD density is less than $5 \times 10^{11}/cm^3$, BMDs do not serve as a sufficient barrier with respect to slip propagation. There is no upper limit to the density and sizes of BMDs which may serve as a barrier to slip propagation, but upper limits of ranges of the BMD density and the size realized in an actual silicon wafer are $5 \times 10^{13}/cm^3$ and 40 nm, respectively, as described later.

The range of the density of BMDs introduced is described below. When the BMDs are present at a high density, virtually all solid solution oxygen has precipitated as BMDs. Meanwhile, the number of oxygen atoms precipitating as BMDs does not exceed the number of oxygen atoms dissolved in CZ-Si as a solid solution, and thus the upper limit of the solid solution oxygen concentration is about $1 \times 10^{18}$ atoms/cm³ at most. Therefore, it can be seen that the density of oxygen atoms precipitating as BMDs is about $1 \times 10^{18}$ atoms/cm³ and it is constant when BMDs are present at a high density. In this state, as the number of BMDs increases, individual sizes of BMDs become small, while the number decreases when the BMD size becomes large. Thus, there are upper limits in the size and the density of the BMDs present at a high density. Accordingly, it is impossible to realize BMDs present at a density of $5 \times 10^{11}/cm^3$ such that their sizes are more than 40 nm, and it is impossible to realize BMDs with sizes of 20 nm or more such that a density of the BMDs is more than $5 \times 10^{13}/$ cm³. Thus, it has been discovered that the ranges of BMD density and BMD size which can suppress slip propagation can be achieved by providing BMDs in a size range of 20 nm to 40 nm, and regulating the density thereof within the range of $5\times10^{11}/cm^3$ to $5\times10^{13}/cm^3$.

It is preferable that the BMD density is towards the high end of the previously described ranges. In order to suppress the length of slips to 5 mm or less, it is more preferable that the BMD density is equal to or greater than $1\times10^{12}/cm^3$.

Another feature of the silicon wafers according to the invention is that the density of BMDs with sizes of 300 nm or more is equal to or less than $1\times10^7/cm^3$. When thermal stress acts on a wafer, a high-density of dislocations is generated within the wafer from BMDs with large sizes acting as a starting point. As a result, the wafer is plastically deformed, which causes warpage. To the contrary, when BMDs serving as the starting point of dislocation decrease, even if thermal stress acts on a wafer, plastic deformation occurs with difficulty, and warpage is reduced. Especially, BMDs with sizes of 300 nm or more tend to act easily as a source of dislocations generation, and if the density of such BMDs exceeds $1\times10^7/cm^3$, dislocation inside the wafer occur at high density, which causes a warpage exceeding 20 µm. Accordingly, by suppressing the density of the BMDs with sizes of 300 nm or more to $1\times10^7/cm^3$ or less, the warpage can be suppressed to 20 µm or less. Further, if the warpage of the wafer is equal to or less than 20 µm, the positional deviation occurring when a semiconductor device pattern is exposed on a silicon wafer does not exceed the allowable range. Accordingly, if the density of BMDs with sizes of 300 nm or more exceeds $1\times10^7/cm^3$, the warpage becomes greater than or equal to 20 µm.

As a heat treatment useful for evaluating resistance to slip and warpage, it is preferable to perform a heat treatment with heating and cooling rates of 30° C./sec or more in a temperature range from 700° C. to 1100° C., and to maintain the silicon wafer at a temperature of 1100° C. or more. The reason why the heat treatment temperature should be $\geqq 700°$ C. is that when the temperature is in this range, generation of slip dislocations and warpage is easy. The reason why the heat treatment temperature should be $\leqq 1100°$ C. is because the upper limit in the device processing is about 1100° C., and phenomena which occur during device processing can be predicted reasonably well by examining wafer characteristics up to 1100° C. The reason why the temperature ramp is $\geqq 30°$ C./sec is that with these heating and cooling rates, thermal stress acting on the silicon wafer is large, so that the possibility of slips and/or warpage occurring becomes significant. Accordingly, if generation of dislocation is prevented in the previously described heat treatment temperature range and heating and cooling rate range, it can be concluded that such a silicon wafer is a silicon wafer where slip dislocation and warpage will not be generated in a general device process.

A feature of the silicon wafers according to the invention is that the length of the slip generated in the abovementioned heat treatment is equal to or less than 10 mm, and warpage of the wafer after heat treatment is equal to or less than 20 µm.

The silicon wafers according to the present invention includes silicon wafers doped with nitrogen, hydrogen, or both nitrogen and hydrogen. This is based upon discoveries related to the manufacturing methods for silicon wafers according to the present invention.

Measurements of the BMD size distribution and density can be made by conventional measuring methods. Specifically, such measurement includes measurement utilizing a transmission electron microscope and/or an Optical Precipitate Profiler or the like. Slip dislocation can be conventionally measured, for example, by X-ray topograph. Warpage can be measured by conventional methods such as observing using an FT-90A manufactured by NIDEK Corporation, or the like.

Manufacturing Method of Silicon Wafer

The manufacturing method according to the present invention is a method for manufacturing a silicon wafer having the features described above. Regarding growth of a silicon single crystal ingot in the inventive method, the CZ method is preferably used, but the FZ method can also be used by controlling the oxygen concentration contained in the substrate. The growing method can be selected properly according to the kind of semiconductor silicon wafer, its performance or the like which is required, by the presence/absence of doping with various elements, and by the size (diameter, weight or the like) of an intended ingot.

The apparatus used for the manufacture of silicon wafers according to the present invention is not especially limited, and any apparatus used for silicon single crystal manufacture according to the normal CZ method may be used. Methods for slicing a substrate from a silicon single crystal ingot is also not limited, and conventional methods can be used. Specifically, a slicer with an inner peripheral blade, a wire saw, or the like can be used.

Devices used in the heat treatment and the high temperature anneal step according to the present invention are also not limited, and conventional known devices are preferably used. Specifically, the device used in the heat treatment includes a vertical furnace of a batch type, and the device used in the high temperature anneal step includes a batch type vertical furnace having an oxygen purge function. Both the heat treatment and the high temperature anneal step can be conducted continuously using a batch type vertical furnace having an oxygen purge function.

The silicon wafers of the invention are preferably derived from a silicon single crystal ingot grown while maintaining a cooling rate in a range in which a center temperature of the crystal during growth changes from 1000° C. to 900° C. at a rate of 5° C./min or more. This is based upon the present inventors' discovery that the temperature range where the abovementioned cooling rate is maintained considerably influences the BMD size decrease and when growth is performed while maintaining the cooling rate in such a range, the density of BMDs with sizes of 300 nm or more can be suppressed to $1\times10^7/cm^3$ or less. Cooling may be performed at the abovementioned cooling rate in other temperature ranges as well, but in these other temperature ranges BMD size reduction is not greatly affected.

It is preferable that the cooling rate is increased in the temperature range of 1000° C. to 900° C., to 7° C./min or more in order to suppress the density of BMDs with sizes of 300 nm or more to $1\times10^7/cm^3$ or less.

In another aspect of silicon wafer manufacture, a substrate (sliced from the silicon single crystal ingot grown by the abovementioned growing method) is heat treated at a temperature of 400° C. to 850° C. for 30 minutes to 4 hours, and then heat treated in a high-temperature anneal step at a temperature of 1100° C. to 1250° C. for 10 minutes to 2 hours in rare gas having an impurity concentration of 0.5% or less by volume, or under a non-oxidizing atmosphere where a thickness of an oxidized film after heat treatment is suppressed to 2 nm or less.

The inventors have found that heat treating at a relatively low temperature where the temperature is in the range of 400° C. to 850° C. is remarkably effective for achieving the abovementioned high BMD density from a lower end of the DZ layer toward the center of the wafer thickness. The DZ layer is then formed by performing a following high-temperature anneal step. The high density of BMDs formed during the low-temperature heat treatment does not disappear even in the high-temperature anneal step.

When the heat treatment temperature is less than 400° C., since diffusion of oxygen does not occur at a significant rate, BMD formation does not occur, and therefore the BMD density becomes less than $5 \times 10^{11}/cm^3$, which is undesirable. When the heat treatment temperature is more than 850° C., BMD nucleation centers disappear, and the BMD density becomes less than $5 \times 10^{11}/cm^3$, which again is undesirable.

When the heat treatment time is less than 30 minutes, since oxygen diffusion is slow, BMD formation does not occur, therefore the BMD density becomes less than $5 \times 10^{11}/cm^3$, which is undesirable. When the heat treatment time exceeds 4 hours, the BMD total density exceeds $5 \times 10^{13}/cm^3$, and the density of BMDs with sizes of 20 nm or more becomes less than $5 \times 10^{11}/cm^3$. In addition, the manufacturing process is further prolonged, which results in an undesirable decrease in productivity.

It is necessary to suppress oxidized film growth on the surface of the wafer by performing the subsequent high-temperature anneal step under a rare gas atmosphere with an impurity concentration of 0.5% or less by volume. When the impurity concentration exceeds 0.5% by volume, the oxidized film on the surface exceeds 2 nm in thickness, which is undesirable. The reason for suppressing the oxidized film on the surface to thickness of 2 nm or less is for promoting outward diffusion of oxygen and facilitating void contraction and disappearance in the vicinity of the surface. Meanwhile, when the oxidized film thickness on the surface exceeds 2 nm, outward diffusion of oxygen from regions near the wafer surface is suppressed. As a result, inner wall oxidized films of voids located in the vicinity of the wafer surface do not dissolve, so that void contraction and disappearance does not occur during the anneal, which is undesirable.

When the abovementioned anneal temperature is less than 1100° C., the rate of void reduction is low, such that voids near the surface remain, which is undesirable. When the anneal temperature exceeds 1250° C., since degradation of members of the anneal furnace is significant, the replacement frequency of furnace components increases, which results in an undesirable increase in cost.

When the abovementioned anneal time is less than 10 minutes, the time for void reduction is short such that voids near the surface undesirably remain. When the anneal time exceeds 2 hours, the total anneal time becomes long, which results in a decrease in productivity, which is undesirable.

The manufacturing of silicon wafers according to the present invention includes a manufacturing method where the oxygen concentration of the substrate just after being sliced from a crystal is in a range of $7 \times 10^{17}$ atoms/cm$^3$ to $9 \times 10^{17}$ atoms/cm$^3$.

By establishing an oxygen concentration of the substrate just after being sliced from a single crystal ingot ("as grown") to $7 \times 10^{17}$ atoms/cm$^3$ or more, a high density of BMDs with a density of $5 \times 10^{11}/cm^3$ or more can be realized when heat treatment is performed in the temperature range of 400° C. to 850° C. for a time period from 30 minutes to 4 hours. By limiting the oxygen concentration of the substrate to $9 \times 10^{17}$ atoms/cm$^3$ or less, disappearance of grown-in defects present on the surface of the silicon wafer is facilitated by the high-temperature anneal, and it becomes possible to form a wide DZ layer, for example one with a width of 5 μm or more.

Manufacturing a substrate having the abovementioned oxygen concentration can be performed by appropriately controlling the oxygen concentration in the melt, the number of rotations of the crucible, or the like.

The process of the invention includes a manufacturing method where the nitrogen concentration in the substrate just after being sliced from the single crystal ingot is in the range of $1 \times 10^{13}$ atoms/cm$^3$ to $8 \times 10^{15}$ atoms/cm$^3$. When the nitrogen concentration in the substrate is in the range of $1 \times 10^{13}$ atoms/cm$^3$ to $8 \times 10^{15}$ atoms/cm$^3$, silicon wafers obtained by the abovementioned heat treatment having the previously described BMD density can be further reduced in warpage compared with substrates which are not doped with nitrogen.

When the nitrogen concentration in the substrate is $\geq 1 \times 10^{13}$ atoms/cm$^3$, propagation of dislocations generated by BMDs is suppressed so that warpage can be further reduced compared with the case of a substrate which is not doped with nitrogen, but when the nitrogen concentration is $\geq 8 \times 10^{15}$ atoms/cm$^3$, multi-crystallization takes place, which may result in lowering of yield, which is undesirable. Such substrates can be produced by conducting growth of a silicon single crystal ingot in the CZ method from a melt doped with nitrogen in an amount of $1 \times 10^{16}$ atoms/cm$^3$ to $1 \times 10^{19}$ atoms/cm$^3$. As methods for adding nitrogen to melt, the conventional method is preferably used, for example by dipping a wafer with a nitride film in melt.

The process of the invention includes a manufacturing method where a hydrogen concentration in the substrate just after being sliced from a single crystal ingot is in the range of $1 \times 10^{12}$ atoms/cm$^3$ to $5 \times 10^{16}$ atoms/cm$^3$. Even if the oxygen concentration is relatively low, a more preferable BMD density of $1 \times 10^{12}/cm^3$ or more can be realized by addition of hydrogen. The low oxygen concentration is effective for forming a DZ layer with further reduced crystal defects. Even if annealing is performed in a low-temperature heat treatment for a relatively short time, the abovementioned BMD density can be realized by the hydrogen addition. This process is advantageous, since an annealed wafer with further reduced surface defects can be manufactured at low cost.

The hydrogen concentration should be $1 \times 10^{12}$ atoms/cm$^3$ or more in order to achieve the abovementioned effect, but when the hydrogen concentration exceeds $5 \times 10^{16}$ atoms/cm$^3$, bubble defects due to hydrogen occur, which is undesirable. Such a substrate can be produced by continuously introducing hydrogen gas into the atmosphere during crystal growth such that a concentration of hydrogen gas is in a range of 0.01% to 3% by volume during crystal growth. When the concentration of the hydrogen gas is less than 0.01%, the hydrogen concentration in the substrate does not reach $1 \times 10^{12}$ atoms/cm$^3$ or more, which is undesirable. When the concentration of the hydrogen gas exceeds 3%, the hydrogen concentration in the substrate exceeds $5 \times 10^{16}$ atoms/cm$^3$, which results in bubble defects, which is also undesirable.

The process of the invention further includes a manufacturing method where a silicon single crystal layer (epi-layer) is deposited by the epitaxial method after the high-temperature anneal.

The present invention will be further explained below in detail referring to the following Examples, but is not limited thereby.

EXAMPLES

Manufacturing Method of Annealed Wafer and Epitaxial Wafer

Annealed wafers and epitaxial wafers were manufactured in the following manner.
(1) Preparation of Melt:
Silicon and doping agent were added to a CZ crucible in a pulling furnace so as to obtain an ingot of the desired resistivity.
(2) Growth of Single Crystal Ingot:
After the melt was prepared by heating the crucible using a heater, a seed crystal was dipped in the melt and pulled up, and a neck portion and an expanded diameter portion were formed while controlling the number of rotations of the crucible and the number of rotations of the seed crystal. After the expanded diameter portion was formed, the diameter of the ingot was controlled by utilizing heater output and pulling speed, and a straight barrel portion was grown such that it reached a predetermined length (wafer with diameter of 200 mm:1000 mm, wafer with diameter of 300 mm:500 mm). Thereafter, a reduced diameter portion was formed and the single crystal ingot was separated from the melt. Conduction types of single crystal ingots obtained were p-type (boron-doped) and n-type (phosphorus-doped).

A cooling rate in a range where the center temperature of the crystal changed from 1000° C. to 900° C. was obtained by the following method. A temperature distribution of a crystal center portion during crystal growth was calculated by heat conduction analysis and a crystal growth axial direction average temperature gradient G [° C./mm] in a range of 1000° C. to 900° C. was obtained. A crystal growth rate average value V [mm/min] was obtained from the experimental result, and V×G [° C./min] was determined as a cooling rate. The heat conduction analysis was performed using FEMAG, a commercially-available heat conduction analysis software.

Changes in the cooling rate in the range where the crystal center temperature changed from 1000° C. to 900° C. were calculated according to the abovementioned method, and performed by placing a heat shield made of metal with excellent heat conduction (for example, silver) or the like at a position where the crystal center temperature changed from 1000° C. to 900° C. The shield may be water-cooled, or the structure or position of the heat shield may be altered to change the pulling-up speed.

(3) Adjustment of Oxygen Concentration, Nitrogen Concentration, and Hydrogen Concentration in the Substrate Adjustments of oxygen concentration, nitrogen concentration, and hydrogen concentration in the substrate were conducted in the following manner.

1) Oxygen Concentration:

Oxygen concentration was adjusted by controlling the number of rotations of a crucible or the like to control oxygen concentration in the crystal. The oxygen concentration in the substrate was measured by infrared absorption spectrophotometry and a value of JEITA (Japan Electronics and Information Technology Industries Association) was used as a conversion factor.

2) Nitrogen Concentration:

A relationship between nitrogen concentration in the melt and a nitrogen concentration in the grown crystal was preliminarily obtained, and adjustment of nitrogen concentration was performed by determining a nitrogen concentration in melt from the nitrogen concentration desired in the substrate, and dipping a substrate with a nitride film into the melt to control nitrogen concentration in the melt. The nitrogen concentration in the substrate was measured using the secondary ion mass spectrometer (SIMS). The nitrogen concentration equal to or less than $5 \times 10^{14}$ atoms/cm$^3$ was obtained from calculation using a segregation factor of 0.0007 based upon the concentration of nitrogen added in the melt and the solidification ratio of the crystal.

3) Hydrogen Concentration:

Crystals were preliminarily manufactured with high boron concentration while introducing hydrogen into the atmosphere during crystal growth at various volume ratios. A silicon wafer sliced from the obtained crystals was measured by infrared absorption spectrophotometry, and the hydrogen concentration was obtained from the concentration of hydrogen-boron pairs. A relationship between the volume ratio of the mixed hydrogen and the concentration of hydrogen added in the crystal was preliminarily obtained by this method, and the concentration of hydrogen introduced into the substrate was determined by controlling the volume ratio of the added hydrogen. Mixing of hydrogen was performed by introducing hydrogen from an argon gas port of a silicon single crystal manufacturing apparatus such that hydrogen had a predetermined volume ratio thereof to argon gas.

(4) Slicing Method of Substrate:

Substrates obtained by slicing portions of straight barrel portions of respective single crystal ingots grown by the abovementioned method using a wire saw, and applying mirror processing, were used as substrates.

(5) Heat Treatment (Low-Temperature Heat Treatment and High-Temperature Heat Treatment):

The substrates were introduced into a batch type vertical type heat treatment furnace having a purge function where the temperature within the reaction chamber was held at a predetermined temperature, and subjected to heat treatment (low-temperature heat treatment) under argon gas atmosphere for a predetermined time. Then, the substrates were subjected to high-temperature heat treatment (high temperature anneal) (1200° C.) under an argon atmosphere for a predetermined time (200 mm: one hour, 300 mm: two hours) in the same furnace (hereinafter, wafers after heat treating are called "annealed wafers").

(6) Epitaxial Layer Deposition:

An epitaxial layer with a thickness of 5 μm was deposited on a surface of a portion of the annealed wafer using a vapor growth apparatus (hereinafter, the annealed wafers with deposited epitaxial layer are called "epitaxial wafers").

Measurement and evaluation of annealed wafer and epitaxial wafer

The annealed and epitaxial wafers were measured and evaluated by the abovementioned methods, namely, (1) BMD size distribution measurement, (3) measurement of slip length and evaluation of warpage (RTA heat treatment), and (4) measurement of width of DZ layer. Regarding the wafer doped with nitrogen, (2) nitrogen concentration was measured.

(1) BMD Size Distribution:

The BMD size distribution was measured by infrared interferometry and a transmission electron microscope. As a defect evaluating apparatus based upon infrared interferometry, an OPP (Optical Precipitate Profiler) manufactured by AXENT Technologies Inc. was used. Three portions positioned at depths of 20 μm, 100 μm, and 300 μm from the surface of each of the annealed wafer and the epitaxial wafer were measured. BMD sizes were obtained from signal intensities obtained by applying electrical signal processing to phase differences of transmission lasers and an average value for the three portions was adopted as a representative value. Detection sensitivity was set to a sensitivity which allowed measurement of octahedral BMDs with diagonal lengths of 80 nm or more. The BMD size was again determined as a diagonal length of an octahedral precipitate. As samples for the transmission electron microscope, samples were evaluated at depths of 20 μm, 100 μm, and 300 μm from the surfaces of the annealed and epitaxial wafers and BMD sizes were obtained by measurement of microscope images. The BMD size was determined as a diagonal length of an octahedral precipitate. The BMD density was obtained from the number of BMDs observed in a view field and a volume of the sample corresponding to a region observed. Regarding the BMD density and the BMD size, their average value for three portions were determined as representative values. The density of BMDs with sizes of 20 nm to 40 nm and the density of BMDs with sizes of 300 nm or more were obtained from the BMD size distributions obtained by the OPP and TEM.

(2) Nitrogen Concentrations in Annealed and Epitaxial Wafers:

Samples were taken from the annealed wafers and the epitaxial wafers, and after polishing with up to 20 μm material removal to remove the outward diffusion layers of nitrogen on surfaces of the wafers, the nitrogen concentrations in the wafers were measured using SIMS.

(3) Slip Lengths in Annealed and Epitaxial Wafers and Warpages Thereof:

The annealed and epitaxial wafers were annealed using an RTA (Rapid Thermal Annealer) under the following conditions, ten times.
Insertion: room temperature
Heating rate: 50° C./min
Holding: 1100° C. for 1 minute
Atmosphere: argon
Cooling rate: 30° C./min
Pulling: room temperature Warpages of the annealed wafer and the epitaxial wafer before the RTA heat treatment and after the RTA heat treatment were measured using FT-90A manufactured by NIDEK Corporation. The annealed wafer after the RTA heat treatment was observed using an X-ray topograph, and the maximum length of the observed slips was determined as a representative value.

(4) Width of DZ Layer of Annealed Wafers:

A surface of an annealed wafer was re-polished to a polishing depth X μm, and defects present on the whole face of the re-polished annealed wafer were measured using LSTD scanner (MO-6) manufactured by MITSUI MINING & SMELTING CO., LTD. Since the detection depth obtained by the MO-6 was a depth from the surface of the wafer up to 1 m, defects detected after re-polishing up to X μm were present from the original annealed wafer surface in a depth range of X to (X+1) μm. The detection sensitivity was set to a sensitivity which allowed measurement of grown-in defects with a diagonal length of 100 nm. The volume density of the defects was calculated by dividing the total number of the defects detected by the MO-6 by an area of the measured region and a measurement depth of 1μm. Re-polishing was conducted while changing the polishing depth X variously, and a polishing depth when the volume density of the measured detects became 0.1 piece/cm$^3$ or less was determined as a width of the DZ layer.

Tables 1 to 5 tabulate measurement and evaluation results under various conditions referred to below.

Respective measurement results and evaluation results of annealed and epitaxial wafers:

Regarding wafers obtained by the above methods under various conditions (oxygen concentration, nitrogen concentration, hydrogen concentration, cooling time, and heat treatment time), the results of the above-mentioned measurement (1) and evaluation (3) of the wafer obtained the above-mentioned method are shown in Table 1 to Table 5.

BMD size distributions were measured for annealed wafers with a wafer diameter of 200 mm, both conduction types (p and n), various nitrogen concentrations, hydrogen concentrations, and oxygen concentrations, that were subjected to various low-temperature heat treatment (temperature, time) and a high-temperature annealing treatment. Slips and warpage obtained by evaluation tests are collectively shown in Table 1.

BMD size distributions were measured for annealed wafers with a wafer diameter of 300 mm, both conduction types (p and n), various nitrogen concentrations, hydrogen concentrations, and oxygen concentrations, that were subjected to various low-temperature heat treatment (temperature, time) and a high-temperature annealing treatment. Slips and warpage obtained by evaluation tests are collectively shown in Table 2.

BMD size distributions were measured for epitaxial wafers with wafer diameters of 200 mm and 300 mm, both conduction types (p and n), various nitrogen concentrations, hydrogen concentrations, and oxygen concentrations, that were subjected to a low-temperature heat treatment and a high-temperature annealing treatment, following which the epitaxial layer is deposited. Slips and warpage obtained by evaluation tests are collectively shown in Table 3.

BMD size distributions were measured for annealed wafers with a wafer diameter of 200 mm, both conduction types (p and n), various nitrogen concentrations, hydrogen concentrations, and oxygen concentrations, that were subjected to various low-temperature heat treatments (temperature, time) and a high-temperature annealing treatment. The slips and warpage obtained by evaluation tests are collectively shown in Table 4, as Examples and Comparative Examples.

BMD size distributions were measured for annealed wafers with a wafer diameter of 300 mm, both conduction type (p and n), various nitrogen concentrations, hydrogen concentrations, and oxygen concentrations, that were subjected to various low-temperature heat treatments (temperature, time) and a high-temperature annealing treatment. Slips and warpage obtained by evaluation tests are collectively shown in Table 5 as Examples and Comparative Examples.

The warpage of wafers before the RTA heat treatment was equal to or less than 10 μm. The nitrogen concentrations in the annealed wafer and the epitaxial wafer that were doped with nitrogen remained unchanged from those measured as grown.

The BMD density (1) in Tables refers to the density of BMDs with sizes of 20 nm to 40 nm, while the BMD density (2) refers to the density of BMDs with sizes of 300 nm or more.

Tables 1 to 3, show that when the annealed wafers and the epitaxial wafers of any diameter, regardless of conduction type, satisfy the conditions that the oxygen concentration in each substrate is in a range of $7 \times 10^{17}$ atoms/cm$^3$ to $9 \times 10^{17}$ atoms/cm$^3$, the temperature for the low-temperature heat treatment is in a range of 400° C. to 850° C., the time for the low-temperature heat treatment is set to 30 minutes to 4 hours, and the cooling rate in a range in which a center temperature of crystal changes from 1000° C. to 900° C. is set to 5° C./min or more, the BMD density (1) falls in a range of $5 \times 10^{11}$/cm$^3$ to $5 \times 10^{13}$/cm$^3$, and the BMD density (2) becomes equal to or less than $1 \times 10^7$/cm$^3$. As a result, it is understood that the slip length becomes 10 mm or less, and the warpage is reduced to 20 μm or less.

Even if the BMD density (2) is constant, when the nitrogen concentration of the substrate becomes equal to or greater than $1 \times 10^{13}$ atoms/cm$^3$, warpage is reduced. It should be especially noted, that when the nitrogen concentration is $1 \times 10^{13}$ atoms/cm$^3$ or greater and the BMD density (2) is $1 \times 10^6$/cm$^3$ or less, all the warpages become equal to or less than 10 μm.

Even if the oxygen concentration and the heat treatment conditions are constant, when the hydrogen concentration becomes equal greater or more than $1 \times 10^{12}$ atoms/cm$^3$ or more, the BMD density (1) becomes high and slips are further shortened. It should be especially noted that when the low-temperature heat treatment temperature is equal to or less than 700° C. and the heat treatment time is equal to or more than 30 minutes, the BMD density (1) becomes equal to or more than $1 \times 10^{12}$ atoms/cm$^3$, and the lengths of slips can be suppressed to 5 mm or less.

Widths (depths) of the DZ layers were equal to or more than 5 μm in all wafers. When the nitrogen concentration was equal to or greater than $1\times10^{13}$ atoms/cm$^3$, or when the oxygen concentration was $7\times10^{17}$ atoms/cm$^3$, the widths of the DZ layers were equal to or more than 7 μm, which resulted in wider widths.

From Tables 4 and 5, it can be seen that when the oxygen concentration in the substrate is less than $7\times10^{17}$ atoms/cm$^3$, the BMD density (1) becomes less than $5\times10^{11}$/cm$^3$. As a result, lengths of slips exceed 10 mm.

When the hydrogen gas volume ratio during silicon single crystal growth exceeded 3%, bubble defects occurred, which rendered evaluation impossible. When the nitrogen concentration in the silicon melt exceeded $1\times10^{19}$ atoms/cm$^3$, multi-crystallization occurs, which also rendered evaluation impossible.

It is understood that, when the cooling rate in a period in which the center temperature of crystal changes from 1000° C. to 900° C. is less than 5° C./min, the BMD density (2) exceeds $1\times10^7$/cm$^3$, so that the warpage amount exceeds 20 μm.

When the low-temperature heat treatment is not performed before the high-temperature annealing, when the temperature in the low-temperature heat treatment is less than 400° C. or it is more than 850° C., and when the time is less than 30 minutes, the BMD density (1) becomes less than $5\times10^{11}$/cm$^3$, so that the lengths of slips exceed 10 mm.

Although not described in Table 5, when the oxygen concentration in the substrate exceeded $9\times10^{17}$ atoms/cm$^3$, the width of the DZ layer was less than 5 μm. When the oxidized film thickness of the substrate after annealed exceeded 2 nm, or when the temperature in the high-temperature annealing was less than 1100° C. and the time was less than 10 minutes, the width of the DZ layer was less than 5 μm.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A silicon wafer having, at a position $\geqq$20 μm or more from a wafer surface, a density of BMDs with sizes of 20 nm to 40 nm in the range of $5\times10^{11}$/cm$^3$ to $5\times10^{13}$/cm$^3$, and having a density of BMDs with sizes of 300 nm or more equal to or less than $1\times10^7$/cm$^3$.

2. The silicon wafer of claim 1, which is doped with nitrogen.

3. The silicon wafer of claim 1, which is doped with hydrogen.

4. The silicon wafer of claim 2, which is doped with hydrogen.

5. A method for manufacturing a silicon wafer of claim 1, comprising growing a silicon single crystal ingot while maintaining a cooling rate in a range in which a center temperature of the crystal during crystal growth changes from 1000° C. to 900° C. at a rate of 5° C./min or more; heat treating a wafer sliced from the ingot at a temperature of 400° C. to 850° C. for 30 minutes to 4 hours; high temperature annealing by heat treating the wafer at a temperature of 1100° C. to 1250° C. for 10 minutes to 2 hours under an atmosphere of rare gas having an impurity concentration of 0.5% or less by volume or under a non-oxidizing atmosphere, wherein the thickness of any oxidized film after heat treating is 2 nm or less.

6. The method of claim 5, wherein the oxygen concentration of the wafer immediately after being sliced from the crystal is in the range of $7\times10^{17}$ atoms/cm$^3$ to $9\times10^{17}$ atoms/cm$^3$.

7. The method of claim 5, wherein the nitrogen concentration of the wafer immediately after being sliced from a crystal is in a range of $1\times10^{13}$ atoms/cm$^3$ to $8\times10^{15}$ atoms/cm$^3$.

8. The method of claim 6, wherein the nitrogen concentration of the wafer immediately after being sliced from a crystal is in a range of $1\times10^{13}$ atoms/cm$^3$ to $8\times10^{15}$ atoms/cm$^3$.

9. The manufacturing method of claim 7, wherein the growth of the silicon single crystal ingot is performed from a melt to which nitrogen is added such that the nitrogen concentration falls in a range of $1\times10^{16}$ atoms/cm$^3$ to $1\times10^{19}$ atoms/cm$^3$.

10. The manufacturing method of claim 5, wherein the growth of the silicon single crystal ingot is performed from a melt to which nitrogen is added such that the nitrogen concentration falls in a range of $1\times10^{16}$ atoms/cm$^3$ to $1\times10^{19}$ atoms/cm$^3$.

11. The method of claim 6, wherein the hydrogen concentration of the wafer immediately after being sliced from a crystal is in a range of $1\times10^{12}$ atoms/cm$^3$ to $5\times10^{16}$ atoms/cm$^3$.

12. The method of claim 7, wherein the hydrogen concentration of the wafer immediately after being sliced from a crystal is in a range of $1\times10^{12}$ atoms/cm$^3$ to $5\times10^{16}$ atoms/cm$^3$.

13. The method of claim 8, wherein the hydrogen concentration of the wafer immediately after being sliced from a crystal is in a range of $1\times10^{12}$ atoms/cm$^3$ to $5\times10^{16}$ atoms/cm$^3$.

14. The method of claim 9, wherein the hydrogen concentration of the wafer immediately after being sliced from a crystal is in a range of $1\times10^{12}$ atoms/cm$^3$ to $5\times10^{16}$ atoms/cm$^3$.

15. The method of claim 10, wherein the growth of the silicon single crystal ingot is performed under an atmosphere where hydrogen gas is continuously introduced such that the concentration of hydrogen is within the range of 0.01% to 3% at a volume ratio.

16. The method of claim 5, wherein in a further step, a silicon single crystal epi-layer is epitaxially deposited after the high-temperature anneal.

* * * * *